United States Patent
Doyle et al.

(10) Patent No.: US 10,354,825 B2
(45) Date of Patent: Jul. 16, 2019

(54) APPARATUS AND METHOD USING ELECTRO-ACTIVE POLYMERS AND CONDUCTING PARTICLE INTERCONNECTS

(71) Applicant: International Business Machines Corporation, Armonk, NY (US)

(72) Inventors: Matthew S. Doyle, Chatfield, MN (US); Jeffrey N. Judd, Oronoco, MN (US); Scott D. Strand, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 361 days.

(21) Appl. No.: 15/404,399

(22) Filed: Jan. 12, 2017

(65) Prior Publication Data

US 2018/0198053 A1 Jul. 12, 2018

(51) Int. Cl.
*H01H 57/00* (2006.01)
*H01L 41/193* (2006.01)
*H01C 10/10* (2006.01)
*H01H 1/029* (2006.01)

(52) U.S. Cl.
CPC .......... *H01H 57/00* (2013.01); *H01C 10/106* (2013.01); *H01L 41/193* (2013.01); *H01H 1/029* (2013.01)

(58) Field of Classification Search
CPC ...... H01H 57/00; H01H 1/029; H01C 10/106; H01L 41/193
USPC .................................................. 310/319, 800
See application file for complete search history.

(56) References Cited

U.S. PATENT DOCUMENTS

| | | | |
|---|---|---|---|
| 4,577,979 A | 3/1986 | Kalnin et al. | |
| 6,969,395 B2 | 11/2005 | Eskuri | |
| 7,179,534 B2 | 2/2007 | Forrest et al. | |
| 7,486,003 B1 | 2/2009 | Jang | |
| 8,462,478 B2 | 6/2013 | Skarp | |
| 8,847,466 B2 | 9/2014 | Wunnicke et al. | |
| 2002/0050881 A1* | 5/2002 | Hyman | H01H 1/0036 335/78 |
| 2012/0128960 A1 | 5/2012 | Busgen et al. | |

FOREIGN PATENT DOCUMENTS

| | | |
|---|---|---|
| WO | 2014202687 A1 | 12/2014 |
| WO | 2015167357 A1 | 11/2015 |

OTHER PUBLICATIONS

Lacour, et al. "5-kV Switches on Flexible Plastic Substrate for Electro-active Polymer Actuators" Device Research Conference, 2003 Year: 2003, pp. 83-84.

* cited by examiner

*Primary Examiner* — Derek J Rosenau
(74) *Attorney, Agent, or Firm* — Patterson + Sheridan, LLP

(57) ABSTRACT

An apparatus includes an electro-active polymer (EAP) structure configured to move, responsive to an electrical field, between a first position and a second position. The apparatus also includes a conductive particle interconnect (CPI) including an elastomeric carrier and conductive particles dispersed therein. The CPI is positioned proximate to at least a portion of the EAP structure and is configured to exhibit a first electrical resistance when the EAP structure is in the first position and to exhibit a second electrical resistance when the EAP structure is in the second position, where the first electrical resistance is different from the second electrical resistance.

20 Claims, 6 Drawing Sheets

APPARATUS AND METHOD USING ELECTRO-ACTIVE POLYMERS AND CONDUCTING PARTICLE INTERCONNECTS

I. FIELD OF THE DISCLOSURE

The present application relates to electrical structures. More specifically, the application relates to switches including electro-active polymer structures and conducting particle interconnects.

II. BACKGROUND

Switches may be used to control the flow of electricity between various components in a circuit. Switches typically include contacts (e.g., switch contacts or electric contacts) that form electrical connections with one or more components. Each set of contacts can be in one of two states: "closed," (the contacts are touching and electricity can flow between them), and "open," (the contacts are separated from each other). A mechanical switch can be thought of as having a variable resistance that changes from a large or effectively infinite resistance (e.g., an open) when the switch contacts are not touching to a low or near zero resistance (e.g., a short) when the switch contacts are touching. Other switching structures, such as transistors, also exhibit a variable resistance; although in the case of transistors, there is a less pronounced difference between the effective open resistance and the effective closed resistance of the transistor.

III. SUMMARY OF THE DISCLOSURE

In a first aspect of the disclosure, an apparatus includes an electro-active polymer (EAP) structure configured to move, responsive to an electrical field, between a first position and a second position. The apparatus also includes a conductive particle interconnect (CPI) including an elastomeric carrier and conductive particles dispersed therein. The CPI is positioned proximate to at least a portion of the EAP structure and is configured to exhibit a first electrical resistance when the EAP structure is in the first position and to exhibit a second electrical resistance when the EAP structure is in the second position, where the first electrical resistance is different from the second electrical resistance.

In a second aspect of the disclosure, a method includes receiving a control signal at a switch. An EAP structure of the switch is configured to move between a first position and a second position responsive to an electrical field associated with the control signal. The method also includes generating, responsive to the control signal, an output based on an electrical resistance characteristic of a CPI of the switch. The CPI includes an elastomeric carrier and conductive particles dispersed therein. The CPI is configured to exhibit a first electrical resistance when the EAP structure is in the first position and to exhibit a second electrical resistance when the EAP structure is in the second position, where the first electrical resistance is different from the second electrical resistance.

In a third aspect of the disclosure, a circuit includes a control line and a switch coupled to the control line. The switch includes an EAP structure configured to move, responsive to an electrical field associated with a control signal received via the control line, between a first position and a second position. The switch also includes a CPI including an elastomeric carrier and conductive particles dispersed therein. The CPI is configured to exhibit a first electrical resistance when the EAP structure is in the first position and to exhibit a second electrical resistance when the EAP structure is in the second position, where the first electrical resistance is different from the second electrical resistance. The circuit also includes an output line coupled to the switch. The output line is configured to provide a current flow based on an electrical resistance of the CPI.

Features and other benefits that characterize embodiments are set forth in the claims annexed hereto and forming a further part hereof. However, for a better understanding of the embodiments, and of the advantages and objectives attained through their use, reference should be made to the drawings and to the accompanying descriptive matter.

IV. BRIEF DESCRIPTION OF THE DRAWINGS

V. DETAILED DESCRIPTION

Figure 1A:
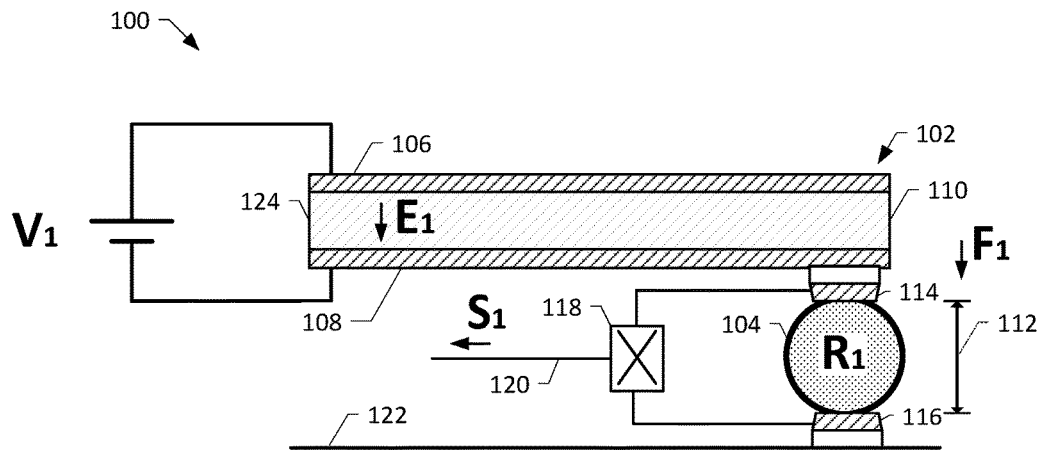
FIGS. 1A and 1B are diagrams illustrating two states of a switch including an electro-active polymer (EAP) structure and a conductive particle interconnect (CPI), according to a first embodiment.

The present disclosure relates to switches that include electro-active polymer (EAP) structures and a conducting particle interconnect (CPI). A CPI may be formed by doping a compliant polymer with conductive particles. A metalized particle interconnect (MPI) is a specific type of CPI in which the conductive particles include metal particles. As a CPI is compressed, increasing numbers of particles come into contact with each other, and this action allows electric current to flow more easily within, on, or through the CPI. Thus, resistance of the CPI varies based on changes in compression (or expansion) of the CPI. For example, as compression causes the conductive particles to move into closer contact, the resistance of the CPI decreases. Conversely, when compression decreases, the conductive particles move farther apart, and the resistance of the CPI increases.

An electro-active polymer (EAP) is a polymer or a set of polymers, e.g., a co-polymer system or a laminate of polymers that exhibits a change of size or shape when subjected to an electric field. In an EAP structure, an EAP is positioned between two electrodes such that the electrodes can apply the electric field to the EAP. Examples of EAPs include ferroelectric polymers (e.g., a polyvinylidene fluoride), electrostrictive graft polymers, and ionic EAPs (e.g., intrinsically conducting polymers, such as polyacetylene and polyphenylene vinylene) or ionic polymer-metal composites, which are similar to dielectric EAPs except that the polymer is conductive).

According to embodiments described herein, a CPI is combined with an EAP structure (or multiple EAP structures) to form a polymer-based switch. The CPI acts as a variable resistance based on force applied to the CPI by the EAP structure(s). The switch is "closed" when the CPI has a first resistance (e.g., a low resistance), and the switch is "open" when the CPI has a second resistance (e.g., a high resistance). The switch may also exhibit a variety of resistance values between a fully open resistance value (e.g., a maximum resistance value of the CPI) and a fully closed resistance value (e.g., a minimum resistance value of the CPI). Thus, the switch can have multiple positions including fully open, fully closed and one or more intermediate positions.

The switch may be actuated (e.g., opened or closed) by application of a voltage across the EAP structure. The applied voltage generates an electric field which causes the EAP to contract, expand, or change shape. Movement of the EAP relative to the CPI due to the electric field changes the force applied to the CPI. For example, if the switch is closed, the switch may be opened by movement of the EAP that reduces a compressive force applied to the CPI, which increases the resistance of the CPI. Conversely, if the switch is open, the switch may be closed by movement of the EAP that increases the compressive force applied to the CPI, which reduces the resistance of the CPI. The switch can be configured as a normally open switch, which may also be referred to as a fail open switch (e.g., a switch that is open unless a voltage is applied to close it) or as a normally closed switch, which may also be referred to as a fail closed switch (e.g., a switch that is closed unless a voltage is applied to open it).

Figure 1B:
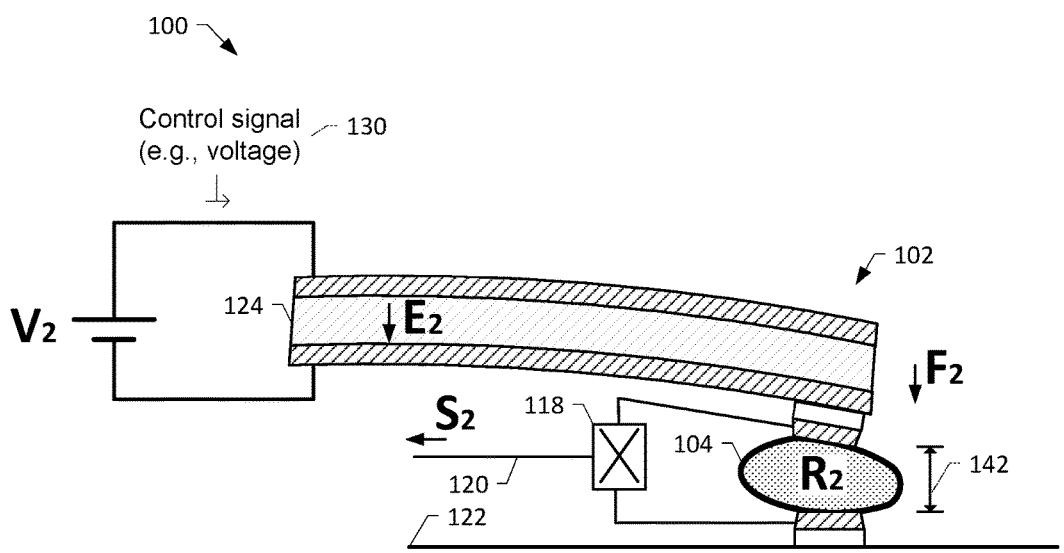

FIGS. 1A and 1B are diagrams illustrating a switch 100 in two different states. In particular, in FIG. 1A, the switch 100 is in a first state, and in FIG. 1B the switch 100 is in a second state. The switch 100 includes a structure 102 and a CPI 104. In FIGS. 1A and 1B, the CPI 104 is positioned between the structure 102 and a surface 122. The surface 122 retains the CPI 104 in proximity to the structure 102. In other examples, the CPI 104 may be retained in position proximate the EAP structure 102 by other features or devices, such as an anchor point, a recess, another EAP structure (e.g., as illustrated in FIGS. 2A-2D, 3A-3B, and 4A-4B), etc.

The structure 102 may include at least two electrodes 106, 108 and a polymer layer 110 between the electrodes 106, 108. For example, in FIGS. 1A and 1B, the electrodes 106, 108 include metallic layers on opposing sides of the polymer layer 110. An electric field (E) may be generated between the electrodes 106, 108 responsive to a control signal (shown in FIG. 1B) that establishes an electrical potential difference (e.g., a voltage (V)) between the electrodes. The shape and/or dimensions of the polymer layer 110 may change based on a magnitude of the electric field. For example, a large voltage applied between the electrodes 106, 108 results in a large change of shape and/or dimensions of the polymer layer 110; whereas a smaller voltage applied between the electrodes 106, 108 results in a smaller change of shape and/or dimensions of the polymer layer 110.

The EAP structure 102 moves responsive to the change of shape and/or dimensions of the polymer layer 110. For example, the EAP structure 102 may be anchored at a first end 124 and free to move at a second end 126. Thus, in FIG. 1A, the EAP structure 102 is in a first position (corresponding to a first state of the switch 100) in response to a first voltage (V1) being applied to the electrodes 106, 108. In FIG. 1B, the EAP structure 102 is in a second position (corresponding to a second state of the switch 100) in response to a second voltage (V2) being applied to the electrodes 106, 108.

For example, if the switch 100 is a normally open switch, the first voltage (V1) may be zero volts (e.g., no electrical potential difference between the electrodes 106, 108, resulting in a first electric field (E1) with a magnitude of zero or nearly zero) or may be greater than zero volts (e.g., a baseline or bias voltage, such that the first electric field (E1) has a magnitude greater than zero). In this example, the second voltage (V2) may be greater than the first voltage (V1) resulting in a second electric field (E2) with a magnitude greater than the magnitude of the first electric field (E1). To illustrate, the EAP structure 102 may have the shape illustrated in FIG. 1A when no voltage is applied to the electrodes 106, 108 and may have the shape illustrated in FIG. 1B when the second voltage (V2) is applied to the electrodes 106, 108.

In an alternative example, the switch 100 may be normally closed switch. In this example, the second voltage (V2) may be zero volts (e.g., no electrical potential difference between the electrodes 106, 108, resulting in the second electric field (E2) having a magnitude of zero or nearly zero) or may be greater than zero volts (e.g., a baseline or bias voltage, such that the second electric field (E2) has a magnitude greater than zero). Further, in this example, the first voltage (V1) may be greater than the second voltage (V2) resulting in a first electric field (E1) with a magnitude greater than the magnitude of the second electric field (E2). To illustrate, the EAP structure 102 may have the shape illustrated in FIG. 1B when no voltage is applied to the electrodes 106, 108 and may have the shape illustrated in FIG. 1A when the first voltage (V1) is applied to the electrodes 106, 108.

A portion of the EAP structure 102 is positioned proximate to the CPI 104. The CPI 104 includes an elastomeric carrier doped with conductive particles. Electrical resistance of the CPI 104 varies depending on a force (F) or forces applied to the CPI 104. For example, when the CPI 104 is compressed (e.g., a compressive force is applied to the CPI 104), the conductive particles may move closer together, which increases conductivity (and decreases resistance) of the CPI 104. Conversely, when the CPI 104 is not compressed (e.g., no compressive force is applied to the CPI 104 or a tensile force is applied to the CPI 104), the conductive particles may move further apart, which decreases conductivity (and increases resistance) of the CPI 104.

To illustrate, in FIG. 1A, the EAP structure 102 is exerting a first force (F1) on the CPI 104. The CPI 104 has a first thickness 112 (or another dimension) when subjected to the first force (F1). When the CPI 104 has the first thickness 112, the CPI 104 exhibits a first electrical resistance (R1). In FIG. 1B, the EAP structure 102 is exerting a second force (F2) on the CPI 104. The CPI 104 has a second thickness 142 (or another dimension) when subjected to the second force (F2), and the second thickness 142 is less than the first thickness 112. That is, the CPI 104 is more compressed in FIG. 1B than in FIG. 1A. When the CPI 104 has the second thickness 142, the CPI 104 exhibits a second electrical resistance (R2) where the second electrical resistance (R2) is less than the first electrical resistance (R1). Although the first force (F1) and the second force (F2) are illustrated in FIGS. 1A and 1B as oriented in the same direction, in other implementations, the first force (F1) may be oriented in a different direction than the second force (F2). For example, the first force (F1) may subject the CPI 104 to tension (e.g., stretch the CPI 104) to change the thickness of the CPI 104. In this example, the first force (F1) may be oriented upward in FIG. 1A.

Although only two positions of the EAP structure 102 (corresponding to two states of the switch 100) are illustrated in FIGS. 1A and 1B, the EAP structure 102 may move to any position within a range between the first position (of FIG. 1A) and the second position (of FIG. 1B). For example, applying a voltage with a magnitude between the first voltage (V1) and the second voltage (V2) may cause the EAP structure 102 to move to a third position (not shown) that is between the first position and the second position. In this example, the CPI 104 may exhibit a third electrical resistance that is between the first electrical resistance (R1) and the second electrical resistance (R2). Thus, the switch 100 may have a continuous or discrete range of states between and including the first state of FIG. 1A and the second state of FIG. 1B.

A circuit 118 may be coupled to the switch 100 to generate an output signal 120 based on the electrical resistance of the CPI 104. For example, the circuit 118 may include a voltage source that applies a known or fixed voltage across conductive contacts 114, 116 that are coupled to the CPI 104. In this example, the output signal 120 generated by the circuit 118 may correspond to or indicate current that flows through the CPI 104 responsive to the voltage applied across the conductive contacts 114, 116. Since the resistance of the CPI 104 changes based on the position of the EAP structure 102, the current of the output signal 120 corresponds to or indicates the position of the EAP structure 102. To illustrate, when the EAP structure 102 in the first position, as illustrated in FIG. 1A, the CPI 104 has the first electrical resistance (R1) resulting in the circuit 118 generating a first output signal (S1) (e.g., a first current). Further, when the EAP structure 102 in the second position, as illustrated in FIG. 1B, the CPI 104 has the second electrical resistance (R2) resulting in the circuit 118 generating a second output signal (S2) (e.g., a second current). Since the second electrical resistance (R2) is less than the first electrical resistance (R1) and the voltage applied across the conductive contacts 114, 116 is fixed or known, the second output signal (S2) has a higher current than the first output signal (S1).

Thus, the EAP structure 102 and CPI 104 can be arranged to form a switch 100 or variable resistance device in order to generate an output signal 120. EAP structures respond quickly to applied electrical fields. Thus, if the control signal 130 is modulated (e.g., time varying), the output signal 120 varies based on the modulation of the control signal 130. To illustrate, when the control signal 130 is a time varying signal, the output signal 120 may vary over time responsive to the control signal 130.

FIGS. 2A, 2B, 2C and 2D are diagrams illustrating four states of a switch 200. In particular, in FIG. 2A, the switch 200 is in a first state; in FIG. 2B, the switch 200 is in a second state; in FIG. 2C, the switch 200 is in a third state; and in FIG. 2D, the switch 200 is in a fourth state. The switch 200 includes two EAP structures 102, 202 and the CPI 104. The EAP structures 102, 202 are arranged so that the CPI 104 is positioned between the EAP structures 102, 202.

The EAP structure 202 may be similar to the EAP structure 102 described with reference to FIGS. 1A and 1B. For example, the EAP structure 202 includes at least two electrodes 206, 208 and a polymer layer 210 between the electrodes 206, 208. The EAP structure 202 may be anchored at a first end 224 and free to move at a second end 226. The electrodes 206, 208 may include metallic layers on opposing sides of the polymer layer 210. An electric field (E) may be generated between the electrodes 206, 208 responsive to a control signal that establishes an electrical potential difference (e.g., a voltage (V)) between the electrodes 206, 208. The shape and/or dimensions of the polymer layer 210 change based on a magnitude of the electric field. For example, a large voltage applied between the electrodes 206, 208 results in a strong electric field and a large change of shape and/or dimensions of the polymer layer 210; whereas a smaller voltage applied between the electrodes 206, 208 results in a weaker electric field and a smaller change of shape and/or dimensions of the polymer layer 210. The EAP structure 202 moves responsive to the change of shape and/or dimensions of the polymer layer 210. To illustrate, in FIGS. 2A and 2B, the EAP structure 202 is in a first position in response to a first voltage (V1) being applied to the electrodes 206, 208; whereas, in FIGS. 2C and 2D, the EAP structure 202 is in a second position in response to a second voltage (V2) being applied to the electrodes 206, 208.

Figure 2A:
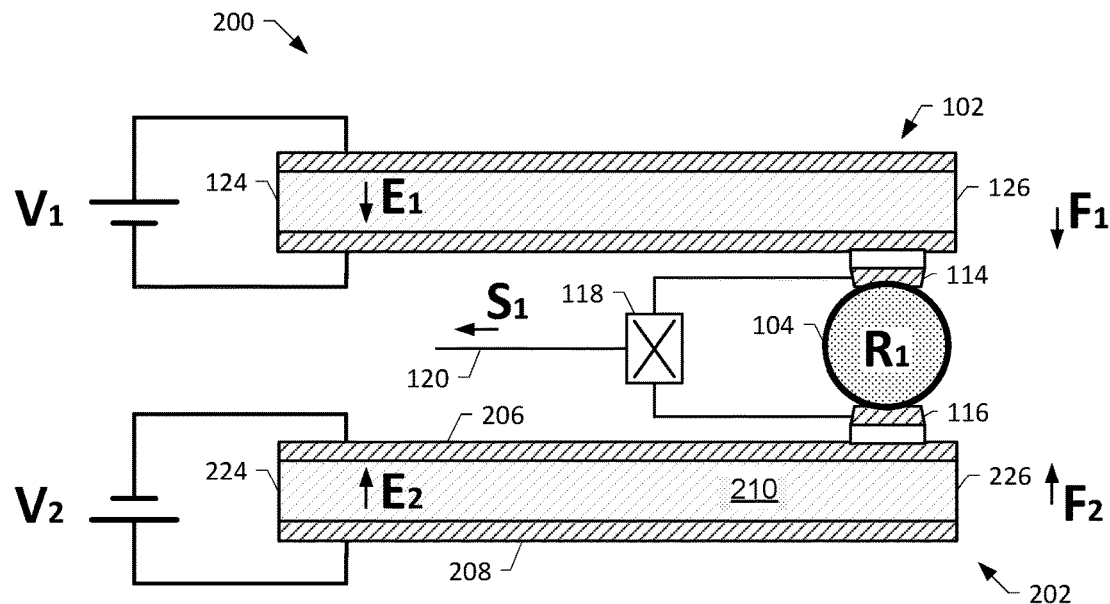
FIGS. 2A, 2B, 2C and 2D are diagrams illustrating four states of a switch including two EAP structures and a CPI, according to a second embodiment.
Figure 2B:
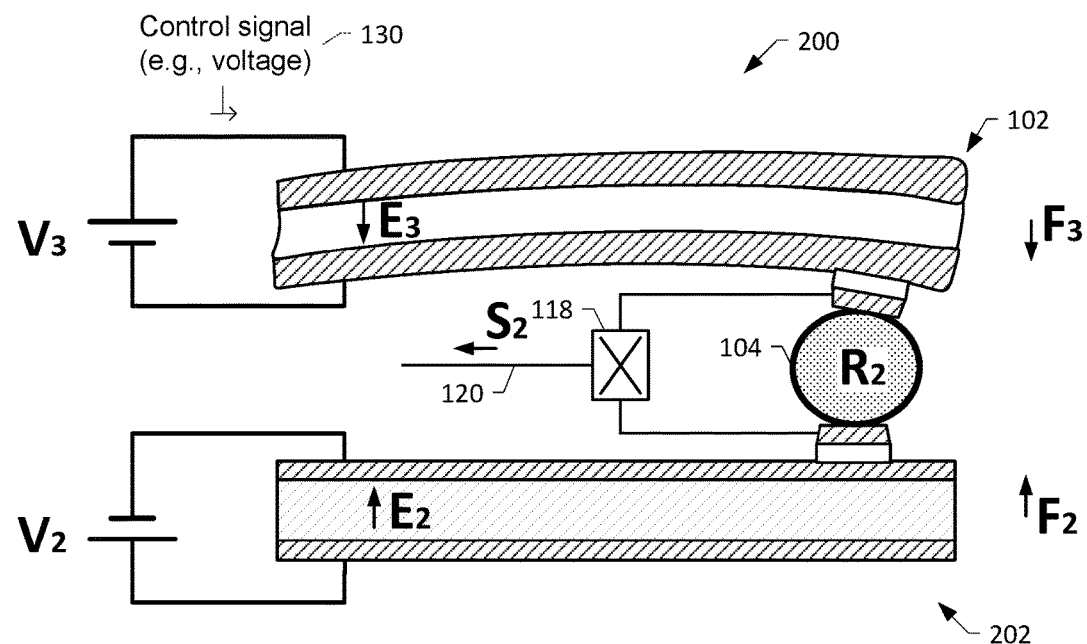

As described with reference to FIGS. 1A and 1B, the switch 200 may be a normally open switch or a normally closed switch. For example, if the switch 200 is a normally open switch, the switch 200 may be in the first state of FIG. 2A when no voltage is applied to the EAP structures 102, 202 or when a bias voltage is applied to the EAP structures 102, 202 (e.g., the voltage (V1) and the voltage (V2) may each be zero volts or a bias voltage). Thus, the electrical field (E1) and the electric field (E2) may have a magnitude that is too low to cause significant deformation of the EAP structures 102, 202, respectively. Accordingly, the force (F1) and the force (F2) correspond to static equilibrium forces when no external power is applied to the switch 200. In this example, FIG. 2A illustrates a resting or non-actuated configuration (e.g., shape) of the EAP structures 102, 202.

Figure 2C:
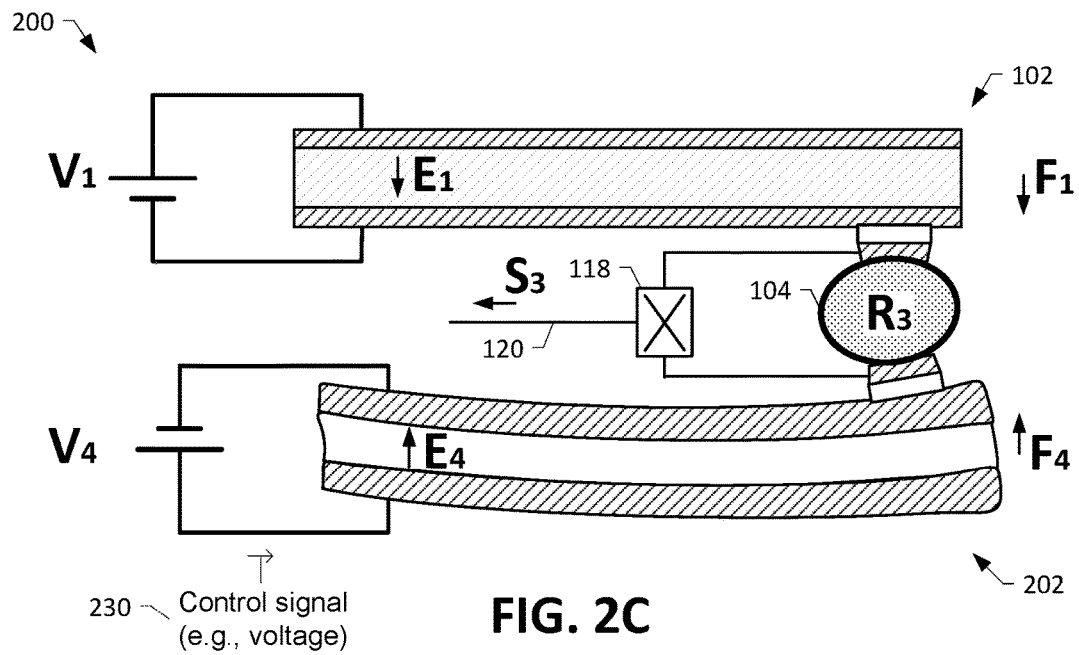
Figure 2D:
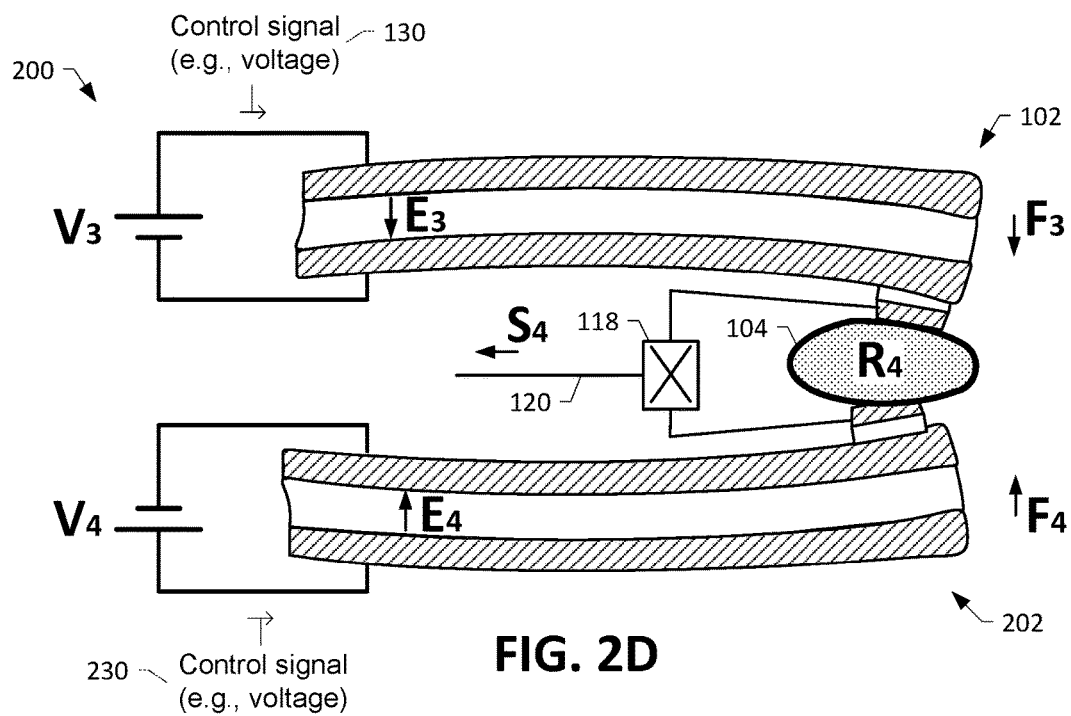

According to another alternative, the switch 200 also may be in the fourth state of FIG. 2D when a bias voltage is applied to the EAP structures 102, 202 (e.g., the voltage (V3) and the voltage (V4) may each be non-zero volts or provide a bias voltage). If a bias voltage is too low, the electrical field (E3) and the electric field (E4) may have a magnitude that is too low to cause significant or substantive deformation of the EAP structures 102, 202, respectively. Accordingly, the force (F3) and the force (F4) may correspond to static equilibrium (non-moving) forces when little or no external power is applied to the switch 200 (i.e., no deformable movement is evident between the conductive contacts 114, 116 and the CPI 104). In this example, FIG. 2D may illustrate a resting or non-actuated configuration (e.g., shape) of the EAP structures 102, 202.

Unlike the switch 100 of FIGS. 1A and 1B, the switch 200 may alternatively be a normally intermediate switch, in which the resting or non-actuated state is neither fully open nor fully closed. To illustrate, the second state of FIG. 2B may correspond to the resting or non-actuated configuration of the EAP structures 102, 202. In this example, the voltage (V3) is zero volts or a bias voltage that does not change the shape or dimensions of the EAP structure 102. Thus, the EAP structure 102 has the shape illustrated in FIG. 2B when no electric field (E3) is applied between the electrodes 106, 108 or when the electric field (E3) has a magnitude that is below a threshold (e.g., a bias electric field). In this example, the CPI 104 has an electrical resistance (R2) when the switch 200 is not actuated. The switch 200 may be actuated to decrease the electrical resistance (R2) to the electrical resistance (R4) by applying the voltage (V4) to the EAP structure 202 as in FIG. 2D. Alternatively, the switch 200 may be actuated to increase the electrical resistance (R2) to the electrical resistance (R1) by applying the voltage (V1) to the EAP structure 102 as in FIG. 2A. In this example, the CPI 104 exhibits the electrical resistance (R3) of FIG. 2C when the voltage (V1) is applied to the EAP structure 102 and the voltage (V4) is applied to the EAP structure 202. The electrical resistance (R3) is less than the electrical resistance (R1) and is greater than the electrical resistance (R4). Depending on the specific configuration of the EAP structures 102, 202, the electrical resistance (R3) may be less than, greater than or approximately equal to the electrical resistance (R2).

As another example of a normally intermediate switch, the third state of FIG. 2C may correspond to the resting or non-actuated configuration of the EAP structures 102, 202. In this example, the voltage (V4) is zero volts or a bias voltage that does not change the shape or dimensions of the EAP structure 202. Thus, the EAP structure 202 has the shape illustrated in FIG. 2C when no electric field (E4) is applied between the electrodes 106, 108 or when the electric field (E4) has a magnitude that is below a threshold (e.g., a bias electric field). In this example, the CPI 104 has an electrical resistance (R3) when the switch 200 is not actuated. The switch 200 may be actuated to decrease the electrical resistance (R2) to the electrical resistance (R4) by applying the voltage (V3) to the EAP structure 102 as in FIG. 2D. Alternatively, the switch 200 may be actuated to increase the electrical resistance (R3) to the electrical resistance (R1) by applying the voltage (V2) to the EAP structure 202 as in FIG. 2A. In this example, the CPI 104 exhibits the electrical resistance (R2) of FIG. 2B when the voltage (V3) is applied to the EAP structure 102 and the voltage (V2) is applied to the EAP structure 202. The electrical resistance (R2) is less than the electrical resistance (R1) and is greater than the electrical resistance (R4). Depending on the specific configuration of the EAP structures 102, 202, the electrical resistance (R2) may be less than, greater than or approximately equal to the electrical resistance (R3).

Although only two positions of each of the EAP structures 102, 202 (corresponding to four states of the switch 200) are illustrated in FIGS. 2A-2D, the EAP structures 102, 202 may each move independently to any position within a range between each of the illustrated positions. For example, applying a voltage with a magnitude between the voltage (V1) and the voltage (V3) to the EAP structure 102 may cause the EAP structure 102 to move to a position (not shown) that is between the position illustrated in FIG. 2A and the position illustrated in FIG. 2B. In this example, the CPI 104 may exhibit an electrical resistance that is between the electrical resistance (R1) and the electrical resistance (R2). Additionally or in the alternative, applying a voltage with a magnitude between the voltage (V2) and the voltage (V4) to the EAP structure 202 may cause the EAP structure 202 to move to a position (not shown) that is between the position illustrated in FIG. 2A and the position illustrated in FIG. 2C. In this example, the CPI 104 may exhibit an electrical resistance that is between the electrical resistance (R1) and the electrical resistance (R3).

The circuit 118 may be coupled to the switch 200 to generate the output signal 120 based on the electrical resistance of the CPI 104 as described with reference to FIGS. 1A and 1B. To illustrate, when the switch 200 is in the position illustrated in FIG. 2A, the CPI 104 has the electrical resistance (R1) resulting in the circuit 118 generating an output signal (S1) (e.g., a first current); when the switch 200 is in the position illustrated in FIG. 2B, the CPI 104 has the electrical resistance (R2) resulting in the circuit 118 generating an output signal (S2) (e.g., a second current); when the switch 200 is in the position illustrated in FIG. 2C, the CPI 104 has the electrical resistance (R3) resulting in the circuit 118 generating an output signal (S3) (e.g., a third current); and when the switch 200 is in the position illustrated in FIG. 2D, the CPI 104 has the electrical resistance (R4) resulting in the circuit 118 generating an output signal (S4) (e.g., a fourth current).

Although FIGS. 2A-2D generally illustrated the EAP structures 102, 202 has having similar displacements responsive to the applied voltages, in some implementations, the EAP structure 102 may have a displacement that is significantly different from the displacement of the EAP structure 202. For example, control voltages applied to the EAP structures 102, 202 may be similar or substantially equal, and the EAP structures 102, 202 may be configured to respond differently to the control voltages. To illustrate, the EAP structure 102 may be stiffer than the EAP structure 202 (e.g., due to different materials or different dimensions of the electrodes 106, 108 or the polymer layer 110 of the EAP structure 102 relative to electrodes 206, 208 or a polymer layer 210 of the EAP structure 202). Thus, the same voltage applied to the EAP structures 102, 202 may result in less displacement of the EAP structure 102 than of the EAP structure 202. As another example, different control voltages may be applied to the EAP structure 102 than to the EAP structure 202. To illustrate, a control signal 230 applied to the EAP structure 202 may be stronger than (e.g., higher voltage) or weaker than (e.g. lower voltage) the control signal 130. Thus, when the control signal 230 is applied to the EAP structure 202, the EAP structure 202 may be displaced by a first amount. Similarly, when the control signal 130 is applied to the EAP structure 102, the EAP structure 102 may be displaced by a second amount. In this example, the first amount may be different than (e.g., greater than or less than) the second amount.

In some implementations, different displacements of the EAP structures 102, 202 may be used for coarse adjustment and fine adjustment of the electrical resistance of the CPI 104. For example, a large displacement of the EAP structure 202 may be used to coarsely adjust the electrical resistance of the CPI 104, and a small displacement of the EAP structure 102 may be used to finely adjust the electrical resistance of the CPI 104.

In some implementations, the control signals 130, 230 may be applied responsive to different processes or conditions. To illustrate, a first controller or control system may send the control signal 130 to the EAP structure 102 and a different controller or control system may send the control signal 230 to the EAP structure 202. Thus, the output signal 120 generated by the circuit 118 be responsive to multiple distinct processes or conditions.

Figure 3A:
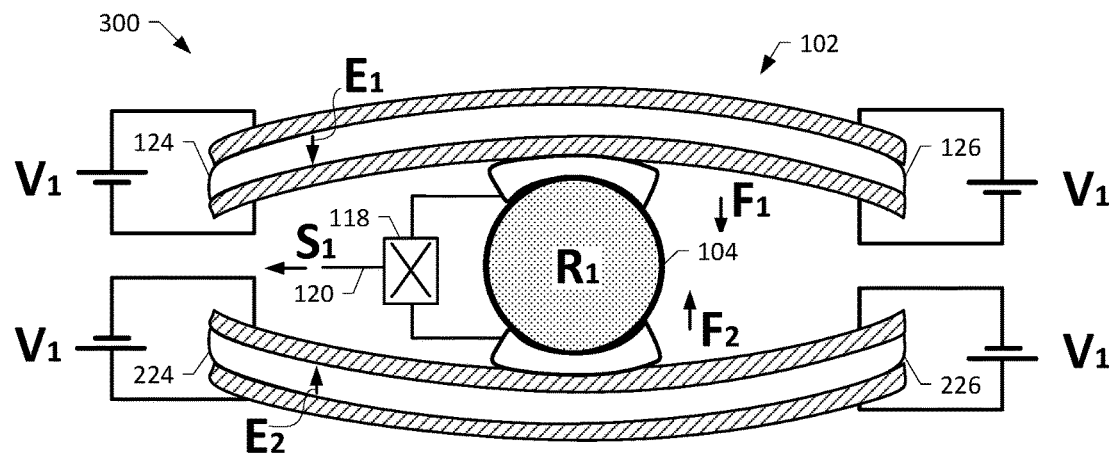
FIGS. 3A and 3B are diagrams illustrating two states of a switch including an EAP structure and a CPI, according to a third embodiment.
Figure 3B:
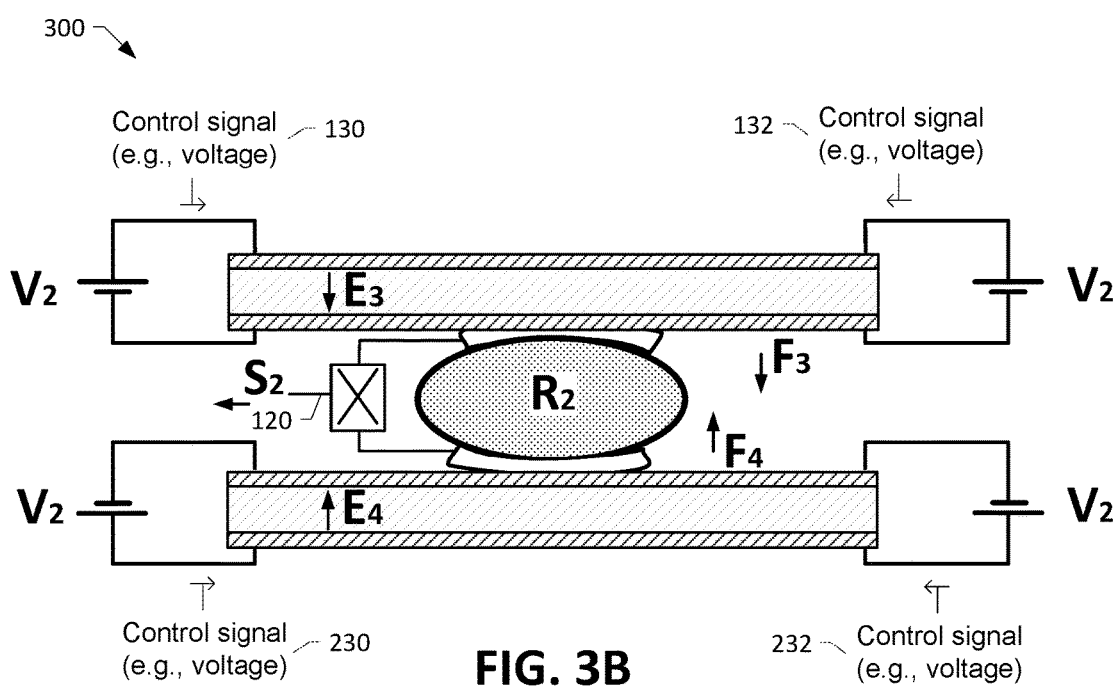

FIGS. 3A and 3B are diagrams illustrating two states of a switch 300. In particular, in FIG. 3A, the switch 300 is in a first state, and in FIG. 3B, the switch 300 is in a second state. The switch 300 includes the two EAP structures 102, 202 and the CPI 104. In FIGS. 3A and 3B, the EAP structures 102, 202 are each anchored at both ends and free to move in the middle (e.g., between the ends). For example, the EAP structure 102 is anchored at the first end 124 and at the second end 126. Likewise, the EAP structure 202 is anchored at the first end 224 and at the second end 226.

Additionally, in FIGS. 3A and 3B, each EAP structure 102, 202 is coupled to more than one voltage source, and thus is configured to responded to more than one control signal. For example, the EAP structure 102 may be configured to move responsive to the control signal 130, responsive to a control signal 132, or responsive to both the control signal 130 and the control signal 132. Similarly, the EAP structure 202 may be configured to move responsive to the control signal 230, responsive to a control signal 232, or responsive to both the control signal 230 and the control signal 232.

Control signals provided to either of the EAP structures 102, 202 may be coordinated or may be independent. For example, the control signal 130 may be provided to the EAP structure 102 when the control signal 132 is provided to the EAP structure 102, and vice versa. To illustrate, both control signals 130, 132 may be responsive to a single control system. Further, the control signal 230 may be provided to the EAP structure 202 when the control signal 232 is provided to the EAP structure 202. To illustrate, both control signals 230, 232 may be responsive to a single control system. In some implementations, the control signals 130, 132 may be responsive to the same control system as the control signals 230, 232. In such implementations, the control signals 130, 132 may be provided to the EAP structure 102 when the control signals 230, 232 are provided to the EAP structure 202, and vice versa.

In some implementations, one or more of the control signals 130, 132, 230, 232 is applied independently of the other control signals. For example, each of the control signals 130, 132 may be below a threshold to cause movement of the EAP structure 102. In this example, one of the control signals 130, 132 may provide a bias signal that is supplemented by the other control signal (when both are present) to cause movement of the EAP structure 102. In this example, the control signals 230, 232 may also be configured such that one of the control signals 230, 232 provides a bias signal that is supplemented by the other control signal (when both are present) to cause movement of the EAP structure 202, or the control signals 230, 232 may be configured to function concurrently or independently to cause movement of the EAP structure 202. Thus, by anchoring the EAP structures at both ends, other control schemes for a switch can be achieved.

As described with reference to FIGS. 1A and 1B and FIGS. 2A-2D, the switch 300 may be a normally open switch, a normally closed switch, or a normally intermediate switch. Further, although only two positions of each of the EAP structures 102, 202 (corresponding to two states of the switch 300) are illustrated in FIGS. 3A and 3B, the EAP structures 102, 202 may each move independently to any position within a range between each of the illustrated positions. Additionally, although FIGS. 3A and 3B generally illustrate the EAP structures 102, 202 as having similar displacements responsive to the applied voltages, in some implementations, the EAP structure 102 may have a displacement that is significantly different from the displacement of the EAP structure 202. For example, different displacements of the EAP structures 102, 202 may be used for coarse adjustment and fine adjustment of the electrical resistance of the CPI 104, as described with reference to FIGS. 2A-2D. Alternatively, or addition, the control signals 130, 132, 230, 232 may be used for fine/coarse adjustment or may be applied responsive to different processes or conditions. Thus, the output signal 120 generated by the circuit 118 be responsive to multiple distinct processes or conditions.

Each of the switches described above (e.g., switches 100, 200 and 300) is illustrated as including a single CPI coupled to at least one EAP structure. However, in some implementations, a switch may include more than one CPI. In such implementations, each CPI may exhibit a corresponding electrical characteristic (e.g., electrical resistance) based on a position of one or more EAP structures. For example, the switch 300 of FIGS. 3A and 3B may include two CPIs position between the EAP structure 102 and the EAP structure 202.

Figure 4:
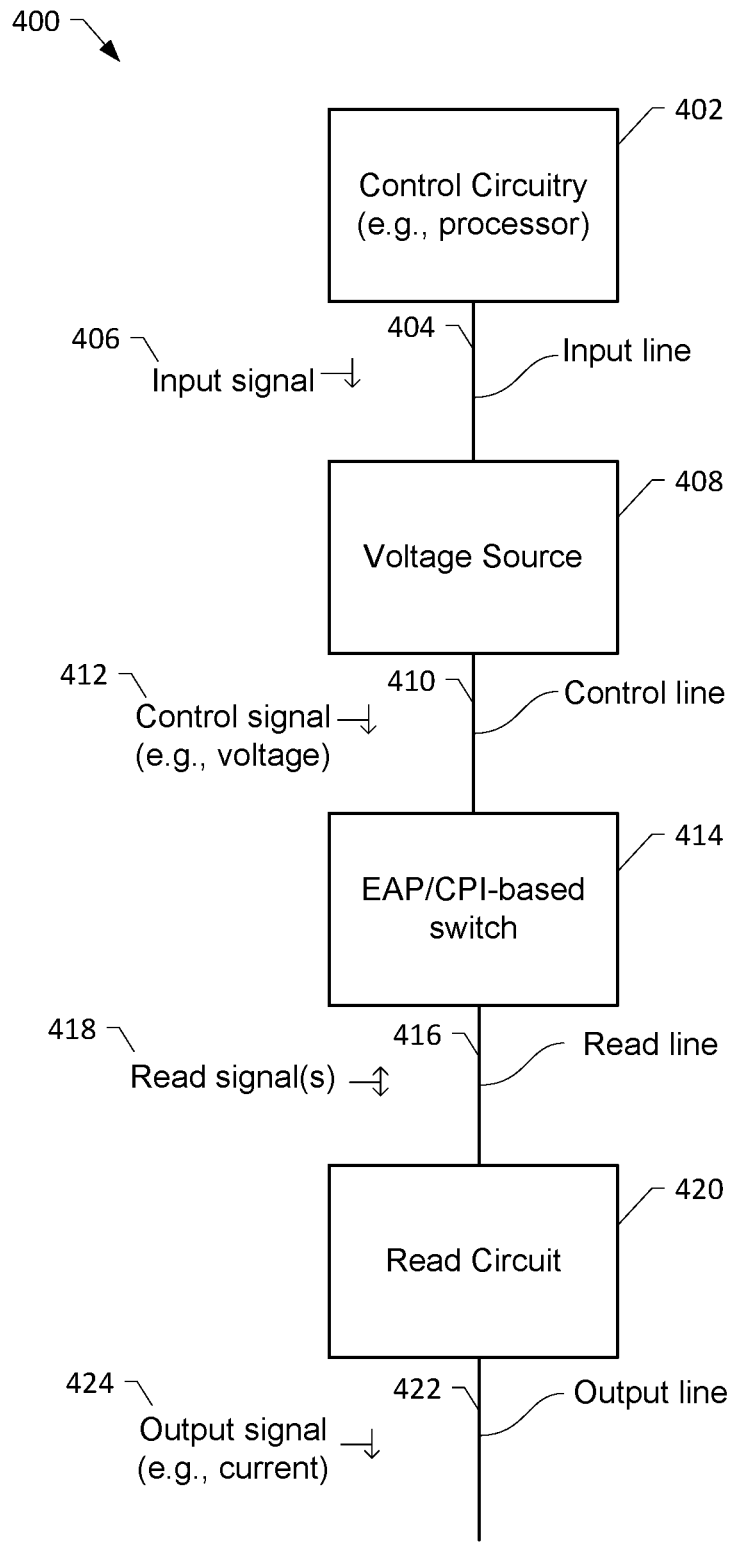
FIG. 4 is a block diagram illustrating a switch coupled to other circuit elements according to a particular embodiment.

FIG. 4 is a block diagram illustrating a system 400 that includes a switch coupled to other circuit elements according to a particular embodiment. The switch of FIG. 4 is an EAP/CPI-based switch 414 that includes at least one EAP structure and at least one CPI. For example, the EAP/CPI-based switch 414 may correspond to or include the switch 100 of FIGS. 1A and 1B, the switch 200 of FIG. 2A-2D, or the switch 300 of FIGS. 3A and 3B.

The system 400 also includes control circuitry 402 that is coupled via an input line 404 to a voltage source 408. In a particular implementation, the control circuitry 402 includes a processor. The control circuitry 402 may also, or in the alternative, include a sensor, one or more logic gates, an application-specific integrated circuit, a field programmable gate array, or other circuitry capable of generating an input signal 406 and providing the input signal 406 to the voltage source 408.

The voltage source 408 may provide a control signal (or more than one control signal) to the EAP/CPI-based switch 414 via a control line 410 (or more than one control line). For example, when the EAP/CPI-based switch 414 corresponds to the switch 100, the voltage source 408 may be configured to provide a single control signal (e.g., the control signal 130) to the EAP structure 102. In another example, when the EAP/CPI-based switch 414 corresponds to the switch 200, the voltage source 408 may be configured to provide multiple controls signals. To illustrate, the voltage source 408 may provide the control signal 130 to the EAP structure 102 and may provide the control signal 230 to the EAP structure 202. Alternatively, when the EAP/CPI-based switch 414 corresponds to the switch 200, the voltage source 408 may be configured to provide the control signal 130 to the EAP structure 102 and another voltage source (not shown) may independently provide the control signal 230 to the EAP structure 202.

In yet another example, when the EAP/CPI-based switch 414 corresponds to the switch 300, the voltage source 408 may be configured to provide the control signals 130 and 132 to the EAP structure 102 and to provide the control signals 230 and 232 to the EAP structure 202. Alternatively, when the EAP/CPI-based switch 414 corresponds to the switch 300, the voltage source 408 may be configured to provide the control signals 130 and 132 to the EAP structure 102 and another voltage source (not shown) may independently provide the control signal 230 and 232 to the EAP structure 202. In yet another alternative example, the voltage source 408 may be configured to provide the control signal 130 to the EAP structure 102 and one or more other voltage source (not shown) may provide the control signal 132 to the EAP structure 102. Further, in this example, one or both of the control signals 230 and 232 may be provided to the EAP structure 202 by the voltage source 408 or by one of the one or more other voltage source (not shown).

The EAP/CPI-based switch 414 exhibits an electrical characteristic responsive to the control signal 412 (and one or more additional control signals if present). For example, the EAP/CPI-based switch 414 may exhibit a particular electrical resistance responsive to the control signal(s). The electrical characteristic may be detected by read circuitry 420. The read circuitry 420 may include or correspond to the circuit 118 of FIGS. 1A, 1B, 2A-2D, 3A and 3B. The read circuitry 420 may be coupled to the EAP/CPI-based switch via one or more read lines 416. The read circuitry 420 may provide a read signal 418 (or read signals) to the EAP/CPI-based switch 414 and generate an output signal 424 indicative of the electrical characteristic based on the read signal(s) 418. For example, the read circuitry 420 may apply a known or fixed voltage signal to a CPI of the EAP/CPI-based switch 414. In this example, the output signal 424 may include a current that flows based on the known or fixed voltage and the resistance of the CPI. The output signal 424 may be provided, via an output line 422, to one or more other circuit components (not shown).

Figure 5:
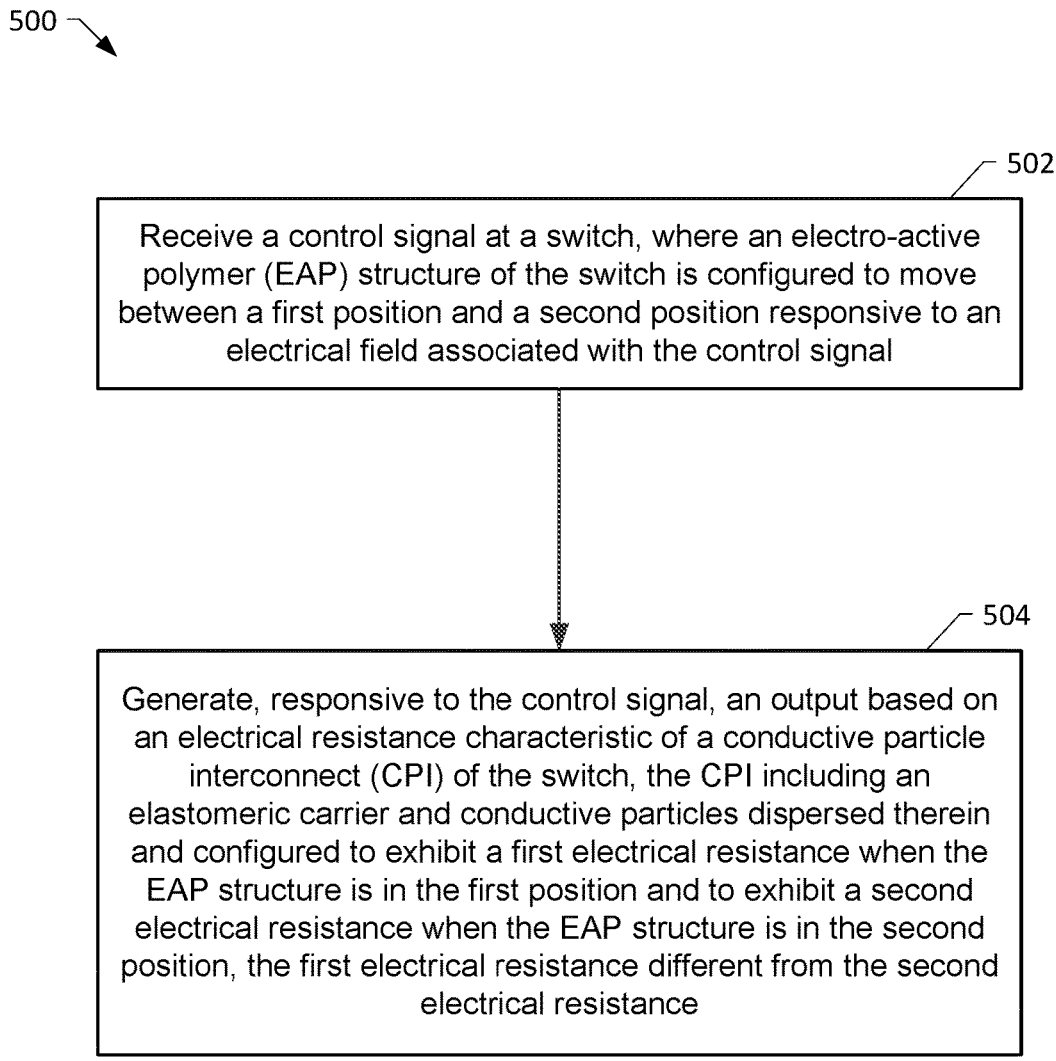
FIG. 5 is a flow chart illustrating a method of use associated with a switch according to a particular embodiment.

FIG. 5 is a flow chart illustrating a method of use associated with a switch according to a particular embodiment. The method 500 include, at 502, receiving a control signal at a switch. The switch is an EAP/CPI-based switch, such as the switch 100 of FIGS. 1A and 1B, the switch 200 of FIGS. 2A-2D, the switch 300 of FIGS. 3A and 3B, or the EAP/CPI-based switch 414 of FIG. 4. For example, the switch includes an electro-active polymer (EAP) structure that is configured to move between a first position and a second position responsive to an electrical field associated with the control signal. In some implementations, as described with reference to FIGS. 2A-2D and FIGS. 3A and 3B, the method 500 may include receiving more than one control signal. For example, when the switch includes multiple EAP structures, more than one control signal may be used to control or position the EAP structures.

The method 500 also includes, at 504, generating, responsive to the control signal, an output based on an electrical resistance characteristic of a conductive particle interconnect (CPI) of the switch. The CPI includes an elastomeric carrier and conductive particles dispersed therein. The CPI is configured to exhibit a first electrical resistance when the EAP structure is in the first position and to exhibit a second electrical resistance when the EAP structure is in the second position, where the first electrical resistance is different from the second electrical resistance. For example, the output based on the electrical resistance characteristic of the CPI may correspond to or include the output signal 120 generated by the circuit 118.

As another example, the output based on the electrical resistance characteristic of the CPI may correspond to or include the output signal 424 generated by the read circuitry 420 as depicted in FIG. 4. A circuity (not shown) coupled to the output line 422 may receive the output signal 424 and perform an action based on the output signal 424. For example, the circuit coupled the output line 422 may include or have access to a lookup table or another data structure that indicates an action to be performed based on the output signal 424.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
an electro-active polymer (EAP) structure configured to move, responsive to an electrical field, between a first position and a second position; and
a conductive particle interconnect (CPI) including an elastomeric carrier and conductive particles dispersed therein, the CPI positioned proximate to at least a portion of the EAP structure and configured to exhibit a first electrical resistance when the EAP structure is in the first position and to exhibit a second electrical resistance when the EAP structure is in the second position, the first electrical resistance different from the second electrical resistance.

2. The apparatus of claim 1, wherein the EAP structure applies a first force to the CPI when the EAP structure is in the first position and applies a second force to the CPI when the EAP structure is in the second position, and wherein a magnitude of the first force is different from a magnitude of the second force.

3. The apparatus of claim 1, wherein the EAP structure applies a first force to the CPI when the EAP structure is in the first position and applies a second force to the CPI when the EAP structure is in the second position, and wherein a direction of the first force is different from a direction of the second force.

4. The apparatus of claim 1, wherein the EAP structure applies a compressive force to the CPI when the EAP structure is in the second position.

5. The apparatus of claim 1, wherein the EAP structure compresses the CPI by a first amount when the EAP structure is in the first position and compresses the CPI by a second amount when the EAP structure is in the second position, and wherein the first amount is different from the second amount.

6. The apparatus of claim 1, wherein the EAP structure includes a first electrode, a second electrode, and a polymer disposed between the first electrode and the second electrode.

7. The apparatus of claim 1, wherein the conductive particles include a metal.

8. The apparatus of claim 1, further comprising a conductive contact positioned between the EAP structure and the CPI.

9. The apparatus of claim 1, further comprising a circuit coupled to the CPI, the circuit configured to generate a signal based on an electrical resistance of the CPI.

10. The apparatus of claim 1, further comprising a second EAP structure configured to move, responsive to a second electrical field, between a third position and a fourth position, wherein an electrical resistance of the CPI varies based on a position of the second EAP structure.

11. The apparatus of claim 10, wherein the CPI is configured to:
exhibit the first electrical resistance when the EAP structure is in the first position and the second EAP structure is in the third position;
exhibit the second electrical resistance when the EAP structure is in the second position and the second EAP structure is in the third position;
exhibit a third electrical resistance when the EAP structure is in the first position and the second EAP structure is in the fourth position; and
exhibit a fourth electrical resistance when the EAP structure is in the second position and the second EAP structure is in the third position, the third electrical resistance different from the fourth electrical resistance.

12. The apparatus of claim 11, wherein the EAP structure applies a first compressive force to the CPI when the EAP structure is in the second position and the second EAP structure applies a second compressive force to the CPI when the second EAP structure is in the fourth position.

13. The apparatus of claim 12, wherein the fourth electrical resistance is less than the third electrical resistance, is less than the second electrical resistance, and is less than the first electrical resistance.

14. The apparatus of claim 12, wherein the first electrical resistance is greater than the third electrical resistance and is greater than the second electrical resistance.

15. The apparatus of claim 1, wherein a magnitude of the electrical field controls an amount of displacement of the EAP between the first position and the second position.

16. A method comprising:
   receiving a control signal at a switch, wherein an electro-active polymer (EAP) structure of the switch is configured to move between a first position and a second position responsive to an electrical field associated with the control signal; and
   generating, responsive to the control signal, an output based on an electrical resistance characteristic of a conductive particle interconnect (CPI) of the switch, the CPI including an elastomeric carrier and conductive particles dispersed therein and configured to exhibit a first electrical resistance when the EAP structure is in the first position and to exhibit a second electrical resistance when the EAP structure is in the second position, the first electrical resistance different from the second electrical resistance.

17. The method of claim 16, wherein the EAP structure is movable through a range of positions between the first position and the second position based on a magnitude of the electrical field, and where the electrical resistance of the CPI varies through a range of electrical resistance values between the first electrical resistance and the second electrical resistance based on a position of the EAP structure.

18. The method of claim 17, wherein a magnitude of the control signal is time varying, wherein a position of the EAP structure and the output varies over time responsive to the control signal.

19. The method of claim 16, wherein the output is generated by applying a voltage to the CPI such that a current corresponding to the output flows based on the electrical resistance characteristic of the CPI.

20. A circuit comprising:
   a control line;
   a switch coupled to the control line and comprising:
      an electro-active polymer (EAP) structure configured to move, responsive to an electrical field associated with a control signal received via the control line, between a first position and a second position; and
      a conductive particle interconnect (CPI) including an elastomeric carrier and conductive particles dispersed therein, the CPI configured to exhibit a first electrical resistance when the EAP structure is in the first position and to exhibit a second electrical resistance when the EAP structure is in the second position, the first electrical resistance different from the second electrical resistance; and
   an output line coupled to the switch, the output line configured to provide a current flow based on an electrical resistance of the CPI.

\* \* \* \* \*